(12) United States Patent
Zhao et al.

(10) Patent No.: US 11,363,680 B2
(45) Date of Patent: Jun. 14, 2022

(54) PLASMA REACTOR AND HEATING APPARATUS THEREFOR

(71) Applicant: Advanced Micro-Fabrication Equipment Inc. China, Shanghai (CN)

(72) Inventors: Kui Zhao, Shanghai (CN); Dee Wu, Shanghai (CN); Tuqiang Ni, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 176 days.

(21) Appl. No.: 16/725,912

(22) Filed: Dec. 23, 2019

(65) Prior Publication Data

US 2020/0214087 A1    Jul. 2, 2020

(30) Foreign Application Priority Data

Dec. 27, 2018  (CN) .......................... 201811607800.4

(51) Int. Cl.
| | |
|---|---|
| H05B 3/68 | (2006.01) |
| H05B 1/02 | (2006.01) |
| H01J 37/32 | (2006.01) |
| H01L 21/67 | (2006.01) |

(52) U.S. Cl.
CPC ...... H05B 1/0233 (2013.01); H01J 37/32724 (2013.01); H01L 21/67248 (2013.01)

(58) Field of Classification Search
CPC ......... H01J 37/32724; H01L 21/67103; H01L 21/67248; H01L 21/6831; H01L 21/6833; H05B 1/0233
USPC ............................................ 219/443.1–468.2
See application file for complete search history.

(56) References Cited

U.S. PATENT DOCUMENTS

| | | | | |
|---|---|---|---|---|
| 6,850,728 | B2 * | 2/2005 | Yokozeki | G03G 15/2042 219/216 |
| 2006/0140691 | A1 * | 6/2006 | Kim | G03G 15/2039 399/330 |
| 2015/0228513 | A1 * | 8/2015 | Parkhe | H01L 21/67103 219/444.1 |
| 2020/0027706 | A1 * | 1/2020 | Jing | H01L 21/67069 |

* cited by examiner

*Primary Examiner* — Sang Y Paik
(74) *Attorney, Agent, or Firm* — Womble Bond Dickinson (US) LLP; Joseph Bach, Esq.

(57) ABSTRACT

Disclosed are a plasma reactor and a heating apparatus therefor, wherein the heating apparatus comprises: a programmable power supply, a heater assembly, and a bandpass filter assembly, the heater assembly being configured for connecting with the programmable power supply via the bandpass filter assembly, the bandpass filter assembly including a plurality of bandpass filters, wherein the programmable power supply may input, based on match relationships between outputted AC heating powers and conduction frequencies of the bandpass filters BPF, an AC heating power to a matched heater unit to perform heating, thereby achieving zoned temperature control; the disclosures offer a simple circuit structure due to eliminating the need of switch elements, thereby offering a simple control manner.

10 Claims, 3 Drawing Sheets

PLASMA REACTOR AND HEATING APPARATUS THEREFOR

FIELD

This application claims priority benefit from Chinese Patent Applications No. 201811607800.4 filed Dec. 27, 2018 the disclosure of which is hereby incorporated herein by reference in its entirety.

The present disclosure relates to semiconductor process equipment, and more particularly relates to a plasma reactor and a heating apparatus therefor.

BACKGROUND

With constant development of science and technology, more and more electronic devices have been applied in people's daily life and work. Owing to great conveniences brought to people's life and work, the electronic devices have become indispensable and essential tools.

A semiconductor chip is the main component for an electronic device to implement various functions. A considerable amount of micro-processing is involved in fabrication of the semiconductor chip. With a plasma reactor, various kinds of through holes or trenches of micro or even nano-meter level may be formed on a wafer; in further combination with other processes such as CVD (Chemical Vapor Deposition), various kinds of semiconductor chip products are finally fabricated. As the etching process becomes increasingly demanding, the control precision requirements on wafer or substrate temperature during a plasma treatment process also become higher and higher. Therefore, conventional plasma reactors generally adopt a heating apparatus having a multi-zone temperature control function.

In conventional plasma reactors, the heating apparatus is configured such that an electronic switch is provided for each heater unit to thereby achieve a zoned temperature control function, resulting in a complex circuit structure.

SUMMARY

In view of the above, a technical solution of the present disclosure provides a plasma reactor and a heating apparatus therefor, which can implement a zoned temperature control function utilizing a programmable power supply and a bandpass filter, resulting in a simple circuit structure, eliminating the need of switch elements, and offering a simple control manner.

To achieve the objectives above, the present disclosure adopts a technical solution below:

A heating apparatus comprises:

a programmable power supply configured for supplying alternating-current AC heating powers; and a heater assembly including a plurality of heater units, the heater assembly being connected to the programmable power supply via a bandpass filter assembly, the bandpass filter assembly including a plurality of bandpass filters;

wherein the programmable power supply inputs, based on match relationships between outputted AC heating powers and conduction frequencies of the bandpass filters, an AC heating power to a matched heater unit to perform heating.

Preferably, in the heating apparatus, an output end of the programmable power supply is connected to a current supply line, and a return end of the programmable power supply is connected to a current return line; and the current return line is connected to an electrode port of a heater unit via a bandpass filter, and the current supply line is connected to the other electrode end of the heater unit.

Preferably, in the heating apparatus, all current supply lines are connected to the output end of the programmable power supply via the $1^{st}$ radio frequency filter, and all current return lines are connected to the return end of the programmable power supplies.

Preferably, in the heating apparatus, the heater assembly has M rows×N columns of heater units;

heater units in the same row are connected to a same current return line via the same bandpass filter; heater units in different rows are connected to different current return lines via different bandpass filters.

Preferably, in the heating apparatus, the programmable power supply includes N output ends, wherein heater units in a same column are connected to a same output end via a same current supply line, and heater units in different columns are connected to different output ends via different current supply lines.

Preferably, in the heating apparatus, the heater assembly has M rows×N columns of heater units;

each heater unit is connected to one current return line via one bandpass filter, respectively; different heater units are connected to different bandpass filters; heater units in a same row are connected to a same current return line.

Preferably, in the heating apparatus, heater units in a same column are connected to a same current supply line, and all current supply lines are connected to a same output end of the programmable power supply.

Preferably, in the heating apparatus, all current return lines are connected to a same return end of the programmable power supply.

Preferably, in the heating apparatus, the programmable power supply can output a plurality of AC heating powers having different central frequencies, wherein bandwidths of all AC heating powers are identical;

frequency ranges of any two AC heating powers do not overlap.

The present disclosure further provides a plasma reactor, comprising: the heating apparatus mentioned above.

It may be seen from the disclosure above that in the plasma reactor and the heating apparatus provided by the technical solution of the present disclosure, the heater assembly is configured for connecting with the programmable power supply via the bandpass filter assembly, the bandpass filter assembly including a plurality of bandpass filters, the programmable power supply may input, based on match relationships between outputted AC heating powers and conduction frequencies of the bandpass filters BPF, an AC heating power to a matched heater unit to perform heating, thereby achieving zoned temperature control, resulting in a simple circuit structure, eliminating the need of switch elements, and offering a simple control manner.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to embodiments of the present disclosure. To those skilled in the art, other drawings may be derived based on the drawings without exercise of inventive work, wherein.

DETAILED DESCRIPTION OF EMBODIMENTS

Hereinafter, the technical solution of the present disclosure will be described in a clear and comprehensive manner with reference to the preferred embodiments in conjunction with accompanying drawings; it is apparent that the embodiments described here are part of the embodiments of the present disclosure, not all of them. All other embodiments obtained by those skilled in the art without exercise of inventive work based on the examples in the embodiments all fall within the protection scope of the present disclosure.

To elucidate the above objective, features, and advantages of the present disclosure, the present disclosure will be described in further detail through preferred embodiments with reference to the accompanying drawings.

Figure 1:
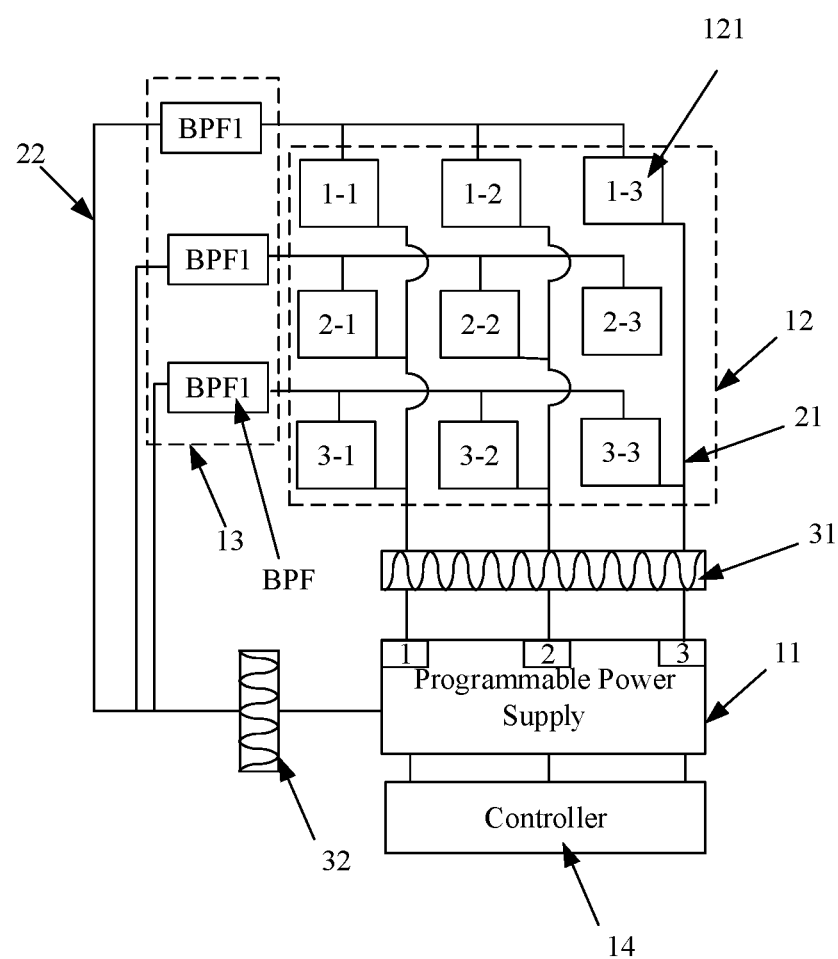
FIG. 1 is a structural schematic diagram of a heater apparatus according to an embodiment of the present disclosure.

FIG. 1 shows a structural schematic diagram of a heating apparatus according to an embodiment of the present disclosure, wherein the heating apparatus may be applied to a plasma reactor or other equipment which needs to be heated. The heating apparatus comprises: a programmable power supply 11 configured for supplying alternating-current AC heating powers; and a heater assembly 12 including a plurality of heater units 121, the heater assembly 12 being connected to the programmable power supply 11 via a bandpass filter assembly 13, the bandpass filter assembly 13 including a plurality of bandpass filters BPF.

Particularly, the programmable power supply 11 inputs, based on match relationships between outputted AC heating powers and conduction frequencies of the bandpass filters BPF, an AC heating power to a matched heater unit to perform heating.

An output end of the programmable power supply 11 is connected to a current supply line 21, and a return end of the programmable power supply 11 is connected to a current return line 22; and the current return line 22 is connected to an electrode end of a heater unit 121 via a bandpass filter BPF, and the current supply line 21 is connected to another electrode end of the heater unit 121.

The programmable power supply 11 can output a plurality of AC heating powers having different central frequencies, wherein the bandwidths of all AC heating powers are identically B; the frequency ranges of any two AC heating powers do not overlap. For example, the frequency of an AC heating power is [fa−B, fa+B], and another AC heating power frequency is [fb−B, fb+B], where fa and fb denote central frequencies of the two AC heating powers, respectively, fa≠fb; then the difference between the two central frequencies has to be greater than 2B, causing their frequency ranges not to overlap. This may avoid frequency overlapping between AC heating powers having different central frequencies, facilitating power supply to a matched heater unit 121 via the corresponding bandpass filter BPF, so as to conduct one or more selected heater units 121 to perform heating, thereby achieving a zoned temperature control function.

In the heating apparatus according to an embodiment of the present disclosure, current supply lines 21 are all connected to an output end of the programmable power supply 11 via a 1$^{st}$ radio frequency filter 31; current return lines 22 are all connected to a return end of the programmable power supply 11 via a 2$^{nd}$ radio frequency filter 32; because the radio frequency signals in the circuit are blocked by the radio frequency filters, system security and reliability is guaranteed.

In the embodiment shown in FIG. 1, the heater assembly 12 has M rows×N columns of heater units 121, M and N being positive integers, at least one of M and N being greater than 1. In FIG. 1, exemplarily, M=N=3. The values of M and N may be selected based on heating size and heating zones of the heating apparatus, including, but not limited to, the embodiment shown in FIG. 1. Letting p be a positive integer not greater than M and q be a positive integer not greater than N, any heater unit 121 may be represented as heater unit p-q in the p$^{th}$ row and q$^{th}$ column.

Heater units 121 in the same row are connected to a same current return line 22 via a same bandpass filter BPF; heater units 121 in different rows are connected to different current return lines 22 via different bandpass filters BPF. In the embodiment shown in FIG. 1, the heater units 121 in the 1$^{st}$ row are all connected to one corresponding current return line 22 via a 1$^{st}$ bandpass filter BPF1, the heater units 121 in the 2$^{nd}$ row are all connected to one corresponding current return line 22 via a 2$^{nd}$ bandpass filter BPF2, and the heater units 121 in the 3$^{rd}$ row are all connected to one corresponding current return line 22 via a 3$^{rd}$ bandpass filter BPF3.

In the embodiment shown in FIG. 1, the programmable power supply 11 has N input ends. Heater units 121 in the same column are connected to a same output end via a same current supply line 21, and heater units 121 in different columns are connected to different output ends via different current supply lines 21. As shown in FIG. 1, the programmable power supply 11 has a 1$^{st}$ output end 1, a 2$^{nd}$ output end 2, and a 3$^{rd}$ output end 3, wherein the heater units 121 in the 1$^{st}$ column are connected to the 1$^{st}$ output end 1 via one corresponding current supply line 21, the heater units 121 in the 2$^{nd}$ column are connected to the 2$^{nd}$ output end 2 via one corresponding current supply line 21, and the heater units 121 in the 3$^{rd}$ column are connected to the 3$^{rd}$ output end 3 via one corresponding current supply line 21.

Each output end at least may output M number of AC heating powers having different central frequencies. The conduction frequency of each bandpass filter BPF is independently matched with one AC heating power with a certain central frequency. In this way, when supplying an AC heating power for the heater units 121 in one column via an output end, only the bandpass filter BPF to which one heater unit 121 in the column is correspondingly connected is conducted, thereby implementing the zoned temperature control function.

In the heating apparatus shown in FIG. 1, each output end may output M number of AC heating powers having different central frequencies, sequentially the 1$^{st}$ AC heating power F1 till the M$^{th}$ AC heating power FM, wherein the central frequency of the i$^{th}$ AC heating power Fi is fi, i being a positive integer not more than M. The same output end only outputs one AC heating power at the same time. The frequency range of the i$^{th}$ AC heating power is [fi−B, fi+B], where B denotes the bandwidth, which for example may be 50 Hz. The bandpass filter assembly 13 has M number of bandpass filters BPF, sequentially the 1$^{st}$ bandpass filter BPF1 till the M$^{th}$ bandpass filter BPFM. As the i$^{th}$ AC heating power is matched to the conduction frequency of the i$^{th}$ bandpass filter BPFi, the i$^{th}$ bandpass filter BPFi may be conducted. For example, the central frequency of the 1$^{st}$ AC heating power is 1000 Hz, the central frequency of the 2$^{nd}$ AC heating power is 1150 Hz, and the central frequency of the $3^{rd}$ AC heating power is 1350 Hz.

In the heating apparatus shown in FIG. 1, in one embodiment, the heater units 121 may be actuated one by one to perform heating. In this case, at one time there is only one output end outputting an AC heating power; this may control conduction of the bandpass filter BPF to which one heater unit 121 is correspondingly connected, such that only that heater unit 121 performs heating. The heater units 121 may be sequentially conducted to perform heating based on a set time sequence of AC heating powers, wherein only one heater unit 121 is in the conducted-to-heat state at one time; namely, at that time, there is only one output end outputting the $i^{th}$ AC heating power, so as to conduct the heater unit 121 in the $i^{th}$ row connected to the output end to perform heating. If the heater unit 1-1 in the $1^{st}$ row and the $1^{st}$ column needs to be conducted, it is needed to output the $1^{st}$ AC heating power F1 via the $1^{st}$ output end 1, such that only the $1^{st}$ bandpass filter BPF1 is conducted to perform heating; in this way, heating may be performed by conducting the heater unit 1-1 in the $1^{st}$ row and the $1^{st}$ column. If the heater unit 2-2 in the $2^{nd}$ row and the $2^{nd}$ column needs to be conducted, it is needed to output the $2^{nd}$ AC heating power F2 via the $2^{nd}$ output end 2, such that only the $2^{nd}$ bandpass filter BPF2 is conducted to perform heating.

In the heating apparatus shown in FIG. 1, according to another embodiment, the heater units 121 are actuated row by row to perform heating. In this case, all output ends output a same AC heating power at the same time; in this way, conduction of one bandpass filter BPF may cause all heater units 121 in the same row connected to the bandpass filter BPF to perform heating. Based on the set time sequence of AC heating powers, the heater units 121 in respective rows may be sequentially conducted to perform heating. Only one row of heater units 121 are in the conducted-to-heat state at the same time. If the heater units 121 in the $1^{st}$ row need to be conducted, it is required that all output ends output the $1^{st}$ AC heating power F1, such that only the $1^{st}$ bandpass filter BPF1 is conducted, causing all heater units 121 in the $1^{st}$ row to obtain the $1^{st}$ AC heating power F1 via the correspondingly connected output ends, so as to perform heating via all heater units 121 in the $1^{st}$ row. If the heater units 121 in the $3^{rd}$ row need to be conducted, it is required that all output ends output the $3^{rd}$ AC heating power F3, such that only the $3^{rd}$ bandpass filter BPF3 is conducted, causing all heater units 121 in the $3^{rd}$ row to obtain the $3^{rd}$ AC heating power F3 via the correspondingly connected output ends, so as to perform heating via all heater units 121 in the $3^{rd}$ row.

The heating apparatus according to an embodiment of the present disclosure further comprises a controller 14. The controller 14, which is connected to the programmable power supply 11, is further configured for controlling an output end of the programmable power supply 11 to output a corresponding AC heating power. With the controller 14, the programmable power supply 11 may be controlled to output AC heating powers in a set time sequence, thereby implementing an automatic zoned heating function.

Figure 2:
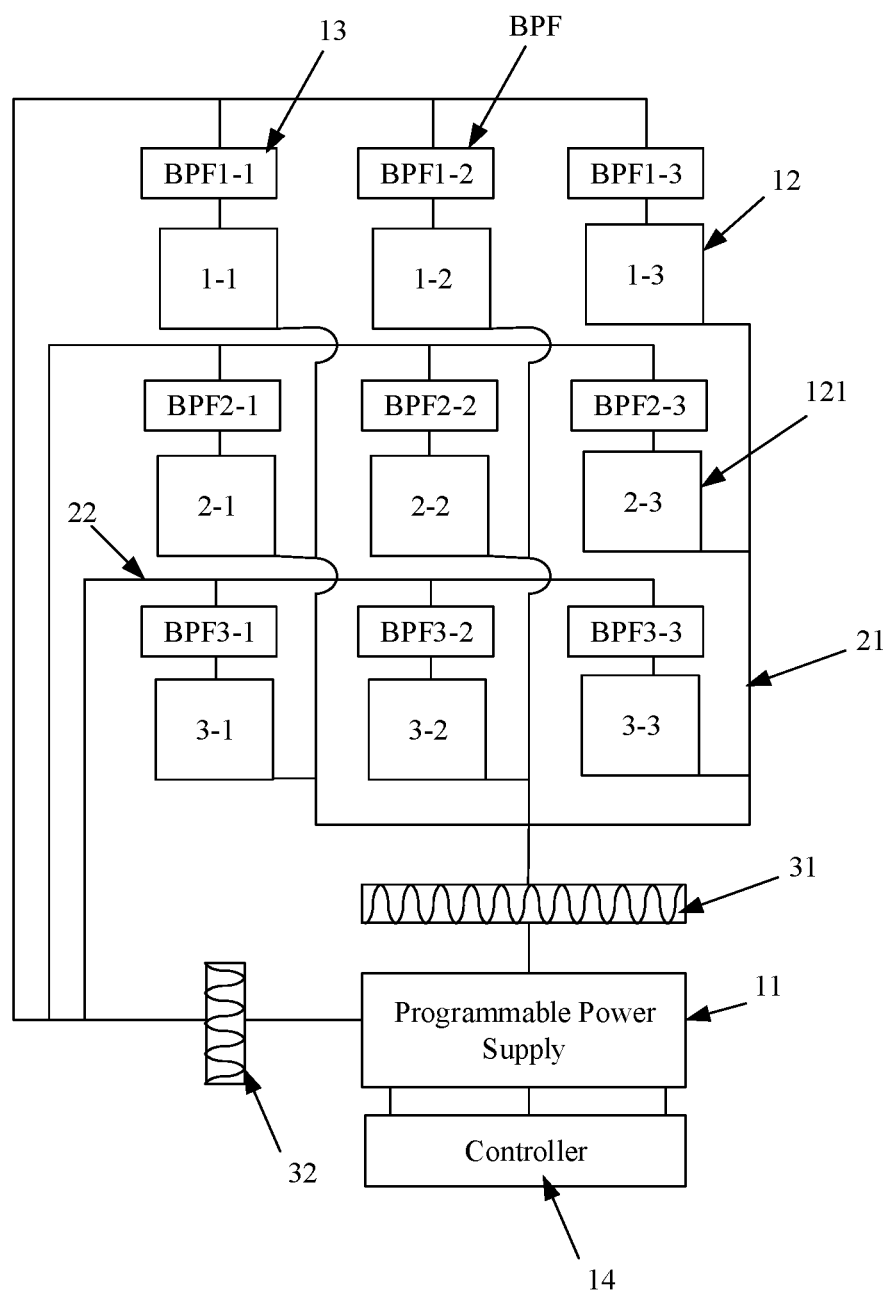
FIG. 2 is a structural schematic diagram of a heater apparatus switch according to another embodiment of the present disclosure.

FIG. 2 shows a structural schematic diagram of a heating apparatus according to another embodiment of the present disclosure. The heating apparatus likewise comprises a programmable power supply 11, a heater assembly 12, and a bandpass filter assembly 13. The heater assembly 12 has M rows×N columns of heater units 121. Likewise, letting p be a positive integer not greater than M and q be a positive integer not greater than N, any heater unit 121 may be represented as heater unit p-q in the $p^{th}$ row and the $q^{th}$ column.

Different from the embodiment shown in FIG. 1, each heater unit 121 is connected to a current return line 22 via a bandpass filter BPF; while different heater units 121 are connected to different bandpass filters BPF, and the heater units 121 in a same row are connected to a same current return line 22. In this case, M×N number of bandpass filters BPF are needed; the bandpass filters BPF being in one-to-one correspondence with the heater units 121. For example, for the heater unit p-q in the $p^{th}$ row and the CO column is connected to bandpass filter BPF p-q in the $p^{th}$ row and the $q^{th}$ column.

In the embodiment shown in FIG. 2, the heater units 121 in the same column are connected to a same current supply line 21, and all current supply lines 21 are connected to a same output end of the programmable power supply 11. The programmable power supply 11 may be provided only with one output end. In other embodiments, a plurality of output ends may be provided, each output end being correspondingly connected to a heater assembly 12.

In the embodiments of the present disclosure, all current return lines 22 are connected to a same return end of the programmable power supply 11. The programmable power supply 11 may alternatively be provided with only one return end. In an alternative embodiment, a plurality of return ends may be provided, each return end being correspondingly connected to one heater assembly 12.

In the heating apparatus shown in FIG. 2, the output end of the programmable power supply 11 may at least output M×N AC heating powers with central frequencies. The conduction frequency of each bandpass filter BPF is independently matched with an AC heating power of one central frequency. In this way, when supplying an AC heating power to heater units 121 in one column via one output end, the bandpass filter BPF connected to each heater unit 121 is conducted under the control of the AC heating power matching its conduction frequency, causing the correspondingly connected heater unit 121 to be conducted to perform heating, thereby implementing a zoned temperature control function.

M×N AC heating powers having different central frequencies are outputted, which are sequentially the $1^{st}$ AC heating power F1 till the M×$N^{th}$ AC heating power, wherein the central frequency of the $j^{th}$ AC heating power is fj, j being a positive integer not greater than M×N. The $j^{th}$ AC heating power may control conduction of the bandpass filter m-n in the $m^{th}$ row and the $n^{th}$ column correspondingly connected to the heater unit m-n in the $m^{th}$ row and the $n^{th}$ column, j=(m−1)×N+n.

In one embodiment of the heating apparatus shown in FIG. 2, the heater units 121 may be actuated one by one to perform heating. In this case, an output end only outputs one AC heating power at the same time, which can only conduct one corresponding bandpass filter BPF, causing conduction of the heater unit 121 correspondingly connected to the bandpass filter BPF to perform heating. Based on a set time sequence of the AC heating powers, respective heater units 121 may be sequentially conducted to perform heating, and at the same time, there is only one heater unit 121 being in a conducted-to-heat state. If it is intended to conduct the heater unit m-n in the $m^{th}$ row and the $n^{th}$ column to perform heating, the $j^{th}$ AC heating power needs to be outputted via the output end, causing the bandpass filter m-n in the $m^{th}$ row and the $n^{th}$ column to be conducted. As such, the heater units 121 may be conducted one by one to perform heating.

In another embodiment of the heating apparatus shown in FIG. 2, a plurality of heater units 121 may be simultaneously actuated to perform heating. In this case, the output ends output a mixing signal at the same time, wherein the mixing signal includes a plurality of AC heating powers having different central frequencies. The plurality of AC heating powers may control conduction of respective matched bandpass filters BPF, causing a plurality of corresponding heater units 121 to be conducted to perform heating.

In the heating apparatus according to an embodiment of the present disclosure, the heating power of a heater unit 121 may be controlled by controlling the amplitude of the AC heating power, and by controlling the frequency range of the AC heating power, conduction of a matched heater unit 121 is chosen to implement a zoned temperature control. Respective heater units 121 may be subjected to fine temperature control to the zones corresponding to respective heater units 121 via the programmable power supply 11 and the bandpass filter BPF, without involvement of any switch device, offering a simple circuit structure and a simple control manner.

Figure 3:
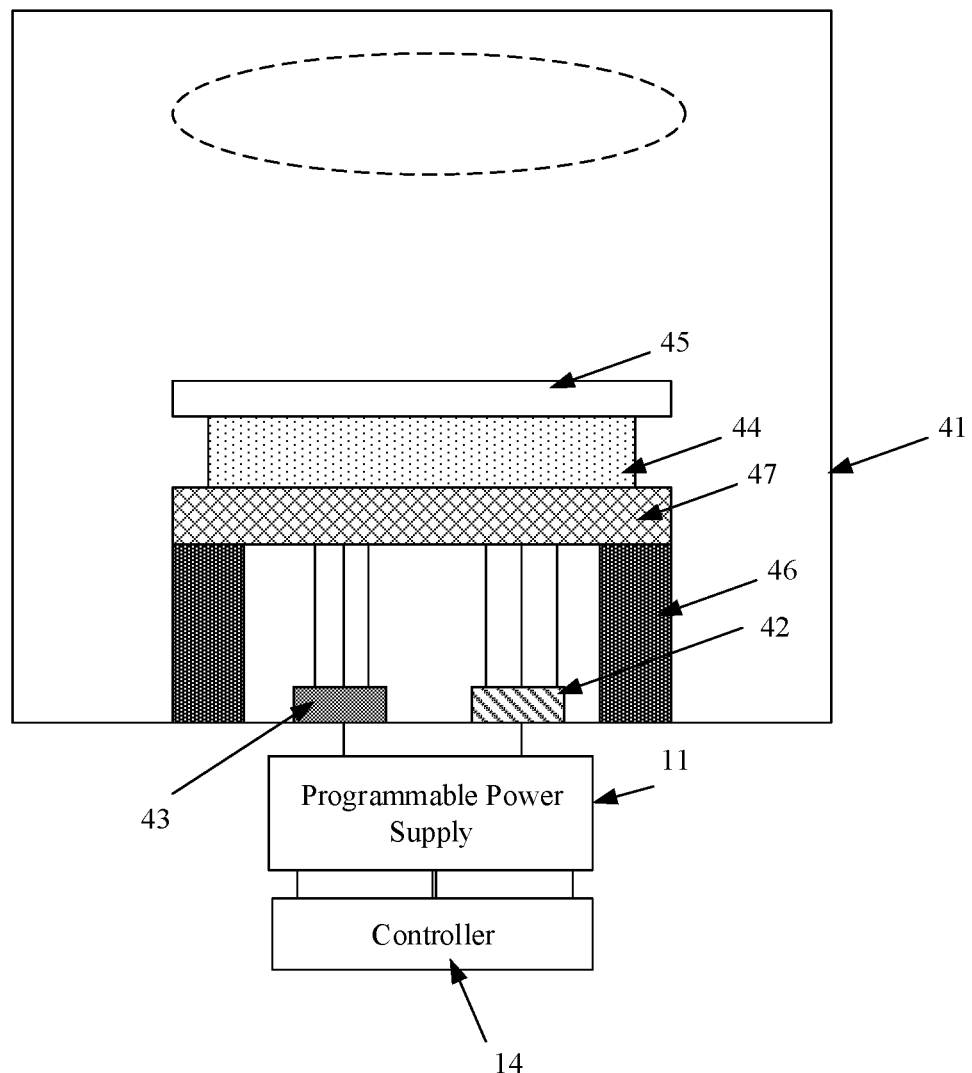
FIG. 3 is a structural schematic diagram of a plasma according to an embodiment of the present disclosure.

Based on the embodiments above, another embodiment of the present disclosure further provides a plasma reactor. Refer to FIG. 3, which shows a structural schematic diagram of a plasma reactor according to an embodiment of the present disclosure, the plasma reactor comprising the heating apparatus according to the embodiments above. Specifically, the plasma reactor comprises: a reaction chamber 41, support means 46 disposed in the reaction chamber 41, an electrically conductive base plate 47 fixed on the top of the supporting means 46, and an electrostatic chuck 44 disposed on the electrically conductive base plate 47, wherein a to-be-processed substrate 45, e.g., a wafer, is fixedly disposed on the electrostatic chuck 44.

The electrostatic chuck 44 includes a heater assembly for the heating apparatus. A $1^{st}$ filter assembly 42 and a $2^{nd}$ filter assembly 43 are provided at the bottom of the reaction chamber 41. The $1^{st}$ filter assembly 42 includes the radio frequency filters mentioned above. The $2^{nd}$ filter assembly 43 includes the bandpass filter assemblies mentioned above. The programmable power supply 11 and the controller 14 are disposed outside the reaction chamber 41.

The plasma reactor according to an embodiment of the present disclosure further has the heating apparatus disclosed above, wherein by controlling the amplitude of an AC heating power, a heating power of a heater unit is controlled; and by controlling the frequency range of the AC heating power, a matched heater unit is conducted, thereby realizing zoned temperature control. Fine temperature control of the zone corresponding to each heater unit may be implemented utilizing the programmable power supply and the bandpass filter, without involving any switch device, thereby offering a simple circuit structure and a simple control manner.

Various embodiments in the present disclosure have been described in a progressive manner, wherein the focuses of different embodiments are different, while the identical or similar parts between respective embodiments may refer to each other. For the plasma reactor disclosed in the embodiments, because it corresponds to the heating apparatus as disclosed, the depictions thereof are simplified, and relevant parts may refer to the corresponding depictions of the heating apparatus.

It may be further noted that in the present disclosure, relational terms such as $1^{st}$ and $2^{nd}$ are only used for distinguishing one entity or operation from another entity or operation, not compulsorily requiring or implying existence of any such practical relationship or sequences between these entities or operations. Moreover, the terms "include," "comprise" or any other variables intend for a non-exclusive inclusion, such that a product or an apparatus including a series of elements not only includes those elements, but also includes other elements that are not explicitly specified, or further includes the elements inherent in the product or apparatus. Without more restrictions, an element limited by the phase "including one . . . " does not exclude a presence of further equivalent elements in the product or apparatus including such an element.

The explanations in the disclosed embodiments facilitate those skilled in the art to implement or use the present disclosure. Various modifications to these embodiments are obvious to those skilled in the art; the general principle defined herein may be implemented in other embodiments without departing from the spirit or scope of the present disclosure. Therefore, the present disclosure is not limited to those embodiments revealed herein, but has the broadest scope consistent with the principle and novelty features disclosed herein.

We claim:

1. A heating apparatus, comprising:
  a programmable power supply configured for supplying alternating-current AC heating powers at different frequencies via a plurality of outputs, wherein each of the outputs receive an alternating-current AC heating power at frequency different from the other outputs; and
  a heater assembly including a plurality of heater units receiving alternating-current AC heating power from the plurality of outputs, the heater assembly being connected to a return line of the programmable power supply via a bandpass filter assembly, the bandpass filter assembly including a plurality of bandpass filters;
  wherein the programmable power supply provides, based on match relationships between frequencies of outputted AC heating powers of each of the outputs and conduction frequencies of the bandpass filters, an AC heating power to a matched heater unit to perform heating.

2. The heating apparatus according to claim 1, wherein an output end of the programmable power supply is connected to a current supply line, and a return end of the programmable power supply is connected to a current return line; and
  the current return line is connected to an electrode end of a heater unit via a bandpass filter, and
  the current supply line is connected to the other electrode end of the heater unit.

3. The heating apparatus according to claim 2, wherein all current supply lines are connected to the output end of the programmable power supply via the $1^{st}$ radio frequency filter, and all current return lines are connected to the return end of the programmable power supplies.

4. The heating apparatus according to claim 2, wherein the heater assembly has M rows×N columns of heater units;
  heater units in the same row are connected to a same current return line via the same bandpass filter; heater units in different rows are connected to different current return lines via different bandpass filters.

5. The heating apparatus according to claim 4, wherein the plurality of output comprise N output ends, wherein heater units in a same column are connected to a same output end via a same current supply line, and heater units in different columns are connected to different output ends via different current supply lines.

6. The heating apparatus according to claim 2, wherein the heater assembly has M rows×N columns of heater units;

each heater unit is connected to one current return line via one bandpass filter, respectively;

different heater units are connected to different bandpass filters; heater units in a same row are connected to a same current return line.

7. The heating apparatus according to claim 6, wherein heater units in a same column are connected to a same current supply line, and all current supply lines are connected to a same output end of the programmable power supply.

8. The heating apparatus according to any one of claims 2-7, wherein all current return lines are connected to a same return end of the programmable power supply.

9. The heating apparatus according to claim 1, wherein the programmable power supply can output a plurality of AC heating powers having different central frequencies, wherein bandwidths of all AC heating powers are identical; and frequency ranges of any two AC heating powers do not overlap.

10. A plasma reactor, comprising the heating apparatus according to any one of claims 1-6.

* * * * *